_ United States Patent_ [19]

Choi

[11] Patent Number: 5,242,851

[45] Date of Patent: Sep. 7, 1993

[54] PROGRAMMABLE INTERCONNECT DEVICE AND METHOD OF MANUFACTURING SAME

[75] Inventor: Kyu H. Choi, Santa Clara, Calif.

[73] Assignee: Samsung Semiconductor, Inc., San Jose, Calif.

[21] Appl. No.: 730,419

[22] Filed: Jul. 16, 1991

[51] Int. Cl.$^5$ .................. H01L 21/70; H01L 21/265
[52] U.S. Cl. .......................... 437/49; 437/60; 437/922
[58] Field of Search ............ 437/43, 48, 52, 192, 437/922, 193, 194, 49; 357/23.5; 365/185

[56] References Cited

U.S. PATENT DOCUMENTS

| 3,634,929 | 1/1972 | Yoshida | 29/577 |
|---|---|---|---|
| 4,442,507 | 4/1984 | Roesner | 365/100 |
| 4,502,208 | 3/1985 | McPherson | 29/584 |
| 4,543,594 | 9/1985 | Mohsen et al. | 357/51 |
| 4,569,120 | 2/1986 | Stacey et al. | 29/574 |
| 4,569,121 | 2/1986 | Lim et al. | 29/574 |
| 4,598,386 | 7/1986 | Roesner et al. | 365/105 |
| 4,605,872 | 8/1986 | Rung | 307/463 |
| 4,648,175 | 3/1987 | Metz, Jr. et al. | 437/193 |
| 4,651,409 | 3/1987 | Ellsworth et al. | 437/52 |
| 4,748,490 | 5/1988 | Hollingsworth | 357/51 |
| 4,796,074 | 1/1989 | Roesner | 357/51 |
| 4,823,181 | 4/1989 | Molsen et al. | 357/51 |
| 4,845,045 | 7/1989 | Shacham et al. | 437/30 |
| 4,876,220 | 10/1989 | Mohsen et al. | 437/170 |
| 4,881,114 | 11/1989 | Mohsen et al. | 357/13 |
| 4,882,611 | 11/1989 | Blecn et al. | 357/51 |
| 4,888,262 | 12/1984 | Basire et al. | 365/104 |
| 5,070,384 | 12/1991 | McCollum et al. | 357/51 |

FOREIGN PATENT DOCUMENTS 1-80038  3/1989  Japan .................. 437/922

_Primary Examiner_—Olik Chaudhuri
_Assistant Examiner_—Loc Q. Trinh
_Attorney, Agent, or Firm_—Townsend and Townsend Khourie and Crew

[57] ABSTRACT

A programmable interconnect device particularly suitable for field programmable ROM, field programmable gate array and field programmable microprocessor code, includes an intrinsic polycrystalline antifuse dielectric layer.

11 Claims, 7 Drawing Sheets

PROGRAMMABLE INTERCONNECT DEVICE AND METHOD OF MANUFACTURING SAME

BACKGROUND OF THE INVENTION

The present invention relates generally to semiconductor device structures and semiconductor processing in integrated circuits and, more particularly, to programmable interconnect devices (PIDs) and method of manufacturing same.

A PID is one type of an antifuse structure. An antifuse structure is a device which operates, as the name implies, in the opposite manner of a fuse. If it is unprogrammed, i.e., prior to the application of a programming voltage, the antifuse forms a high resistance, or open electrical path. If the antifuse structure is programmed by applying a critical voltage across it, it forms a low resistance, or closed electrical path between two conducting lines.

In integrated circuits, multiple layers of interconnecting conducting lines are stacked over each other. Multilayer interconnect structures are formed with insulating layers between the conducting lines. Typically, to form an antifuse structure between first and second lowest conducting layers, the first conducting layer is covered with a thick insulating layer. This first conducting layer may be a doped region in the integrated circuit substrate, a doped region of an epitaxial layer on the substrate, or a doped polycrystalline silicon layer over the substrate. Then, a contact opening is formed through the thick insulating layer where the interconnection is desired. A dielectric antifuse layer is deposited over the thick insulating layer and the contact opening. The important parameters of an antifuse structure largely depend on the material used for this dielectric layer. Then, the second conducting layer is deposited over the dielectric layer. By standard semiconductor processing techniques, the second conducting layer is masked, etched and defined to form a conducting line.

Conventional field programmable devices (FPDs) or antifuse structures typically draw a programming current of approximately 1 milliamp for a programming time of approximately 1 millisecond during programming when a standard programming voltage in the range of 15 to 30 volts is applied. These conventional devices typically have an off-resistance in the range of 10 mega to 10 gigaohms in the unprogrammed state and an on-resistance in the range of 10 to 10000 ohms.

The fabrication process for these devices has some disadvantages. For example, the dielectric antifuse layer may be etched during the pre-metal clean step included in standard CMOS processing. Also during the clean process, defects in the antifuse layer may be generated, which is one of the limiting factors in device yield.

Moreover, with the existing technology, the cost of manufacturing ROMs, PROMs and EPROMs is relatively high. The PROMs have a long access time and the EPROMs are manufactured by complicated process.

SUMMARY OF THE INVENTION

It is an object of the present invention to reduce or eliminate the above-mentioned disadvantages associated with the existing technology.

It is another object of the present invention to provide for a smaller PID cell size.

It is another object of the present invention to provide a method for manufacturing the PIDs compatible with the standard processing technology.

It is another object of the present invention to provide for higher resistance when the PID is unprogrammed and lower resistance when the PID is programmed than conventional antifuse structures.

The present invention is a programmable interconnect device (PID) that includes a layer of intrinsic polycrystalline silicon (poly) in the dielectric antifuse layer of the PID. It has been found that a thin layer of intrinsic poly is sufficient to provide the high-preprogramming resistance required in a PID. Additionally, it has been found that the programming voltage, programming time, and programming current are significantly lower than in conventional PID structures.

According to one aspect of the invention, the antifuse dielectric layer is formed during a standard CMOS process which typically includes a pre-metallization cleaning step to clean oxide and other materials from the surface of the silicon substrate to facilitate a good ohmic contact between the metal and the silicon. The intrinsic poly antifuse layer of the present invention is not etched or degraded by the chemicals utilized to perform this cleaning step so the thickness and electrical characteristics of the antifuse layer are precisely controlled.

According to a further aspect of the invention, a silicon oxide layer is formed over a silicon lower contact in the PID structure prior to the deposition and patterning of the intrinsic poly antifuse layer to prevent out-diffusion of the dopants in the lower contact during normal operation prior to programming the structure.

Other features and advantages will become apparent in view of the appended drawing and following detailed description.

DESCRIPTION OF THE PREFERRED EMBODIMENT

Figure 1A:
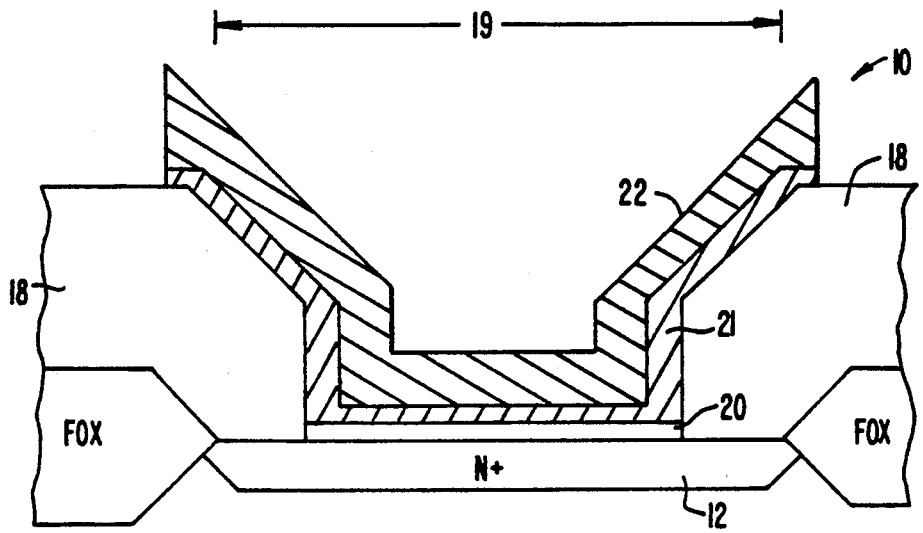
FIG. 1A is a cross-sectional view of one embodiment of the programmable interconnect device according to the present invention.

FIG. 1 illustrates an embodiment of the programmable interconnect device according to the present invention. A PID structure 10 includes a lower conductive layer 12 formed from doped silicon. Conductive layer 12 may be a layer of doped polycrystalline silicon, a conductive region of a semiconductor substrate, or an epitaxial layer on the substrate. Conductive layer 12 is covered with an insulating layer 18 of silicon dioxide. Silicon dioxide 18 is relatively thick, in the range of 5000 to 10000 Angstroms.

Silicon dioxide 18 is etched to form a contact opening 19. A dielectric antifuse layer includes first and second layers 21 and 22 overlying the part lower conductive layer 12 exposed by the contact opening 19.

In contact opening 19, a relatively thin first layer of silicon dioxide 20 is formed on conductive layer 12. The first silicon dioxide 20 has a thickness in the range of 50 to 120 Angstroms. A second layer of intrinsic polycrystalline silicon (poly) 21 in the range of 100 to 3000 Angstroms covers the top surface of the first silicon dioxide layer 20 and is extended onto the top surface of insulating layer 18. On the top surface of the first intrinsic poly layer 21, an upper conductive layer 22 is deposited and is extended onto the top surface of insulating layer 18. Suitable materials for the upper conductive layer 22 include aluminum and alloys of aluminum, molybdenum, and tungsten.

In the unprogrammed state the second intrinsic poly layer 21 acts as a very high resistance barrier between conductive layers 22 and 12. In the programmed state the first intrinsic poly layer 21 undergoes a transition from a very high resistance path to a very low resistance conductive path.

The physics underlying the transition of the antifuse layer in PID from a high resistance to a low resistance during programming is not fully understood. However, it is believed that defects form in the antifuse layer 21 when a high programming voltage is applied and that the metal upper conductive layer 22 melts into the defects and creates short circuits between the upper and lower conductive layers 12 and 22.

In the present invention it is believed that the programming of the intrinsic poly antifuse layer 21 occurs in a two-step process when a programming voltage is applied. First, some of the metal from the upper conductive layer 22 diffuses in the second intrinsic poly layer to establish a threshold current which secondly then increases to cause the aluminum to melt into the antifuse layer. It is believed that this initial diffusion, or a similar mechanism, causes the layer to be programmed by a lower programming voltage and reduces the programming time and programming current.

The programmable interconnect device of the present invention has many desirable operating characteristics. For example, the present programmable interconnect device typically has an off-resistance of 10 gigaohms and an on-resistance of 500 to 1,000 ohms. Furthermore, with a standard programming voltage in the range of 8 to 12 volts applied, the device requires a very low programming current of only about 10 nanoamps and thus a very short programming time of only about 100 nanoseconds.

Moreover, the device can be fabricated without using complex fabrication equipment since it can be easily integrated into any standard CMOS process by adding only a few steps to be described below. Standard programming voltage typically between 8 to 12 volts is used to allow compatibility with the programming of the mainstream field programmable devices. A 12 volt source or an on-chip voltage generating circuit can be used for this purpose.

Figure 1B:
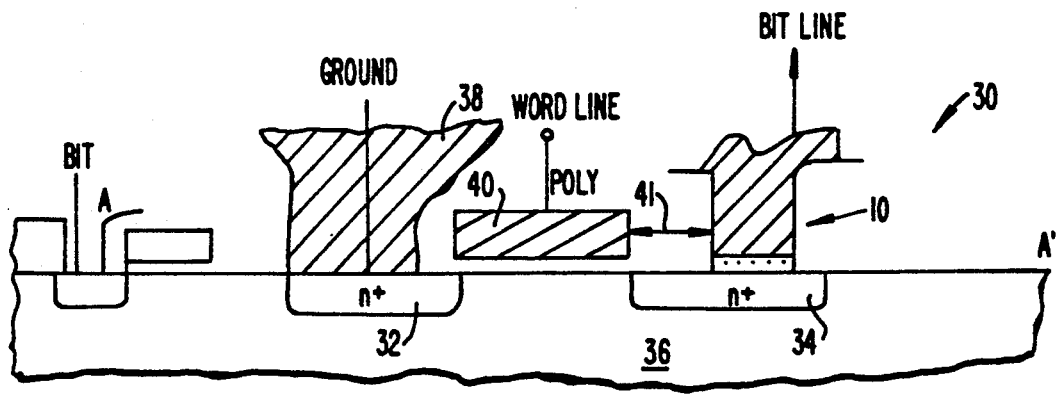
FIGS. 1B and 1C are cross-sectional and top views, respectively, of an single transistor ROM cell utilizing a PID.
Figure 1C:
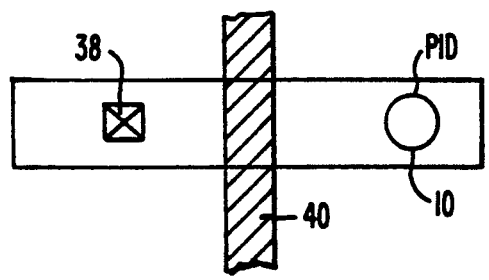

FIGS. 1B and 1C depict a typical device that utilizes a PID. In FIG. 1B a cross-sectional view of a single transistor cell 30 of a read only memory (ROM) is depicted. Ground and bit lines 32 and 34 are n+ diffusions formed in a p substrate 36. An aluminum contact 38 is coupled to the ground line 32 and a PID 10 is connected to the bit line 34. A poly word line 40 forms the gate of the transistor cell 30. FIG. 1C is a top view of the cell depicted in FIG. 1B.

The operation of the ROM cell 30 depicted in FIGS. 1B and 1C will now be described. If the PID is unprogrammed then its resistance is high and no current can flow through the ROM transistor when the word line 40 is activated. Thus bit zero is stored in the ROM cell 30. If it is desired to store bit one in the ROM cell 30 then the PID 10 is programmed to reduce its resistance so that current flows through the ROM transistor cell 30 when the word line 40 is activated.

The word line 40 to PID 10 distance 41 is a critical parameter that determines the minimum cell size. In the present invention the programming voltage is lower than conventional devices so that this distance can be reduced to reduce cell size and increase the density of a ROM array.

Figure 1D:
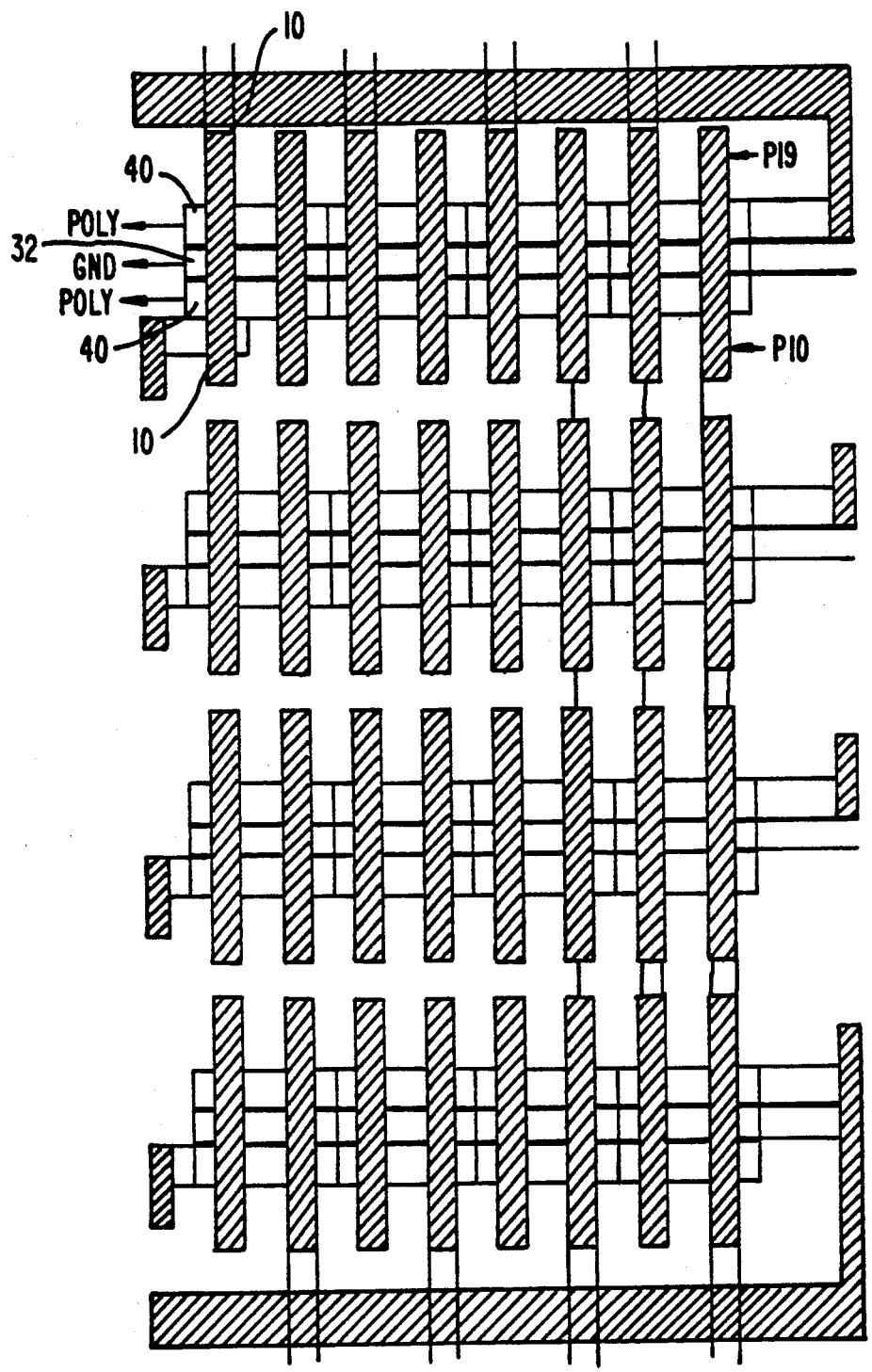
FIG. 1D is a top view of an array of the ROM cells depicted in FIGS. 1B and 1C.

FIG. 1D is a top view of a ROM array utilizing the ROM cells 30 depicted in FIGS. 1B and 1C.

Figure 2A:
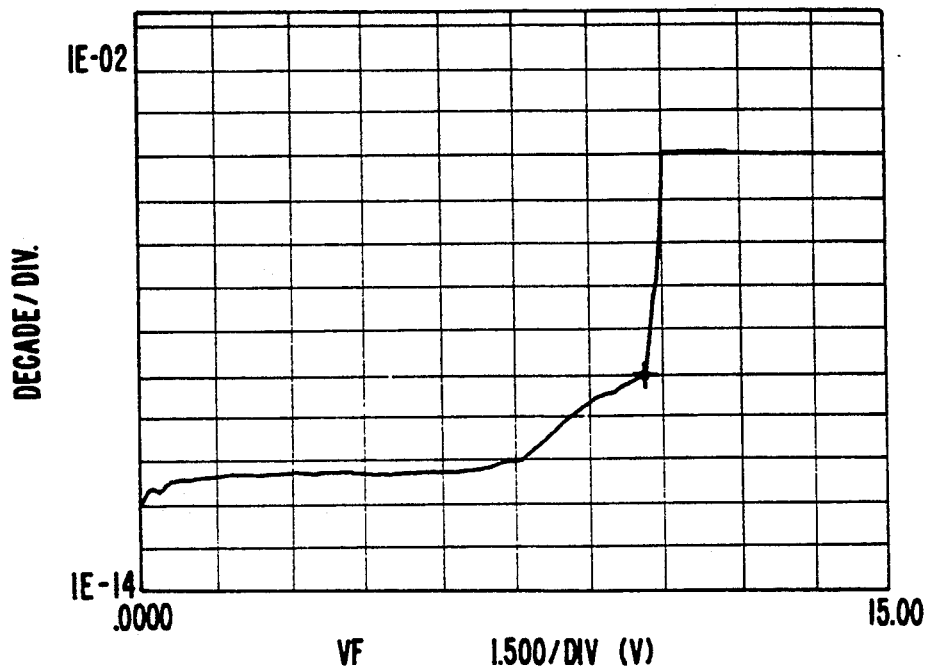
FIGS. 2A-2B are graphs illustrating the I-V curves for the PID device of the present invention.
Figure 2B:
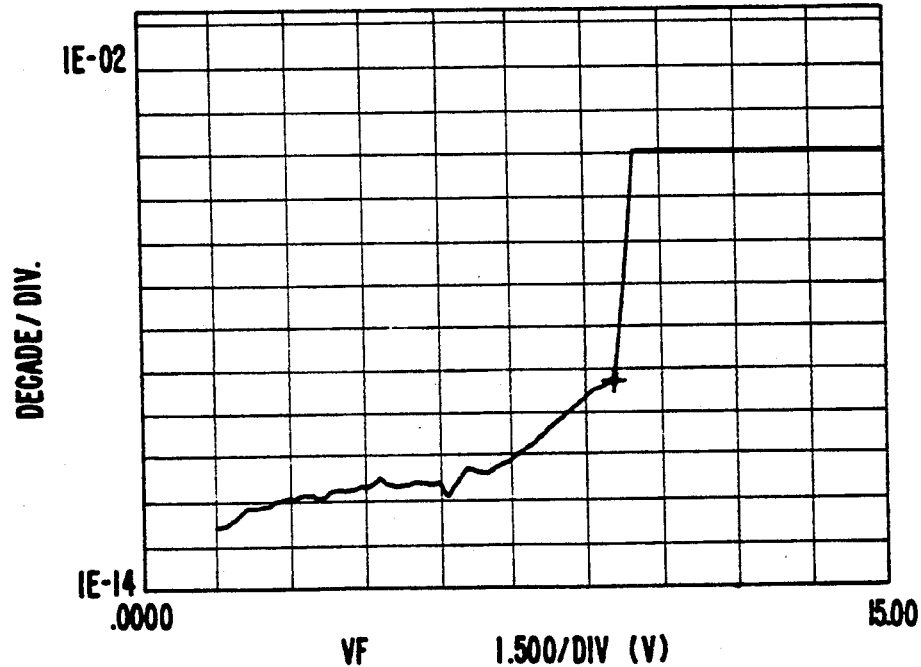

Typical I-V curves for the programmable interconnect device are shown in FIGS. 2A and 2B. Breakdown voltage measurement is performed by ramping the voltage across intrinsic poly 21 and measuring the current and voltage at the point of the transition from a high resistance state to a low resistance state. As shown in both FIGS. 2A and 2B, the programming current is less than 1 nanoamp, which is highly desirable with an on-chip voltage source which can supply only very limited current as it allows for a much shorter programming time of only about 100 nanoseconds.

Figure 3A:
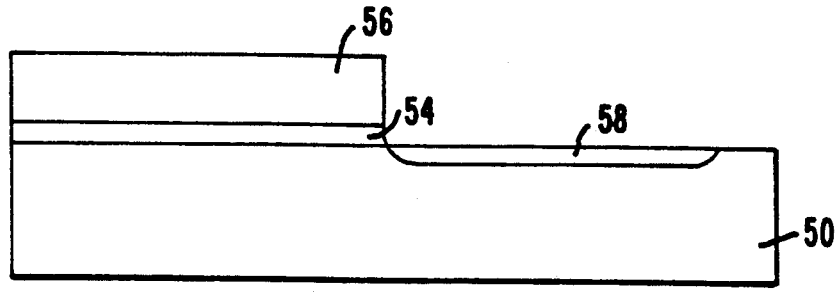
FIGS. 3A-3P are cross-sectional views of standard CMOS processing steps used to manufacture the PID structure shown in FIG. 1.
Figure 3B:
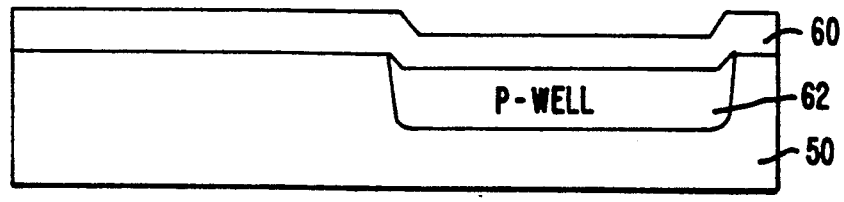
Figure 3C:
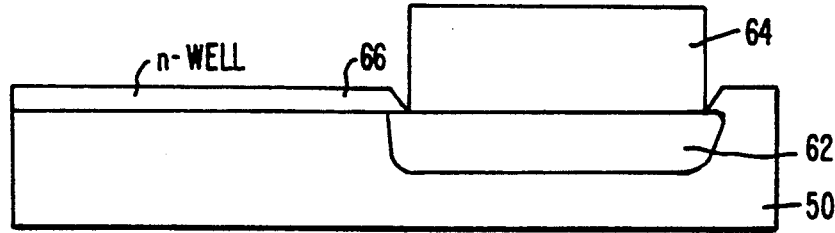
Figure 3D:
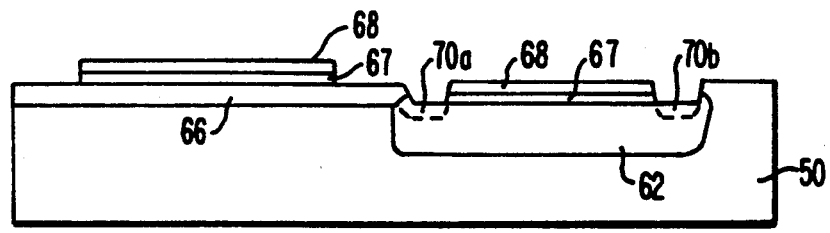
Figure 3E:
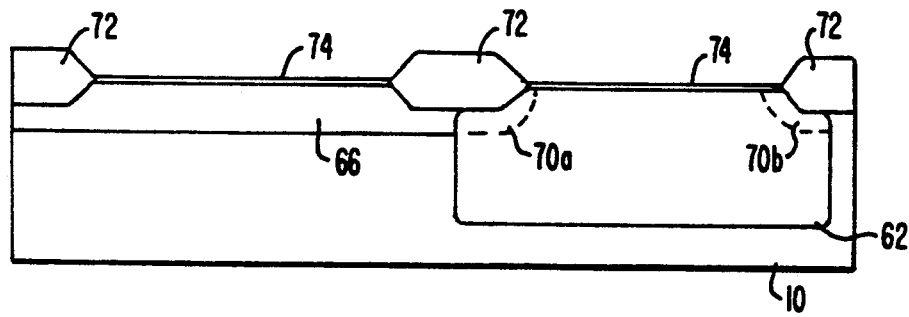
Figure 3F:
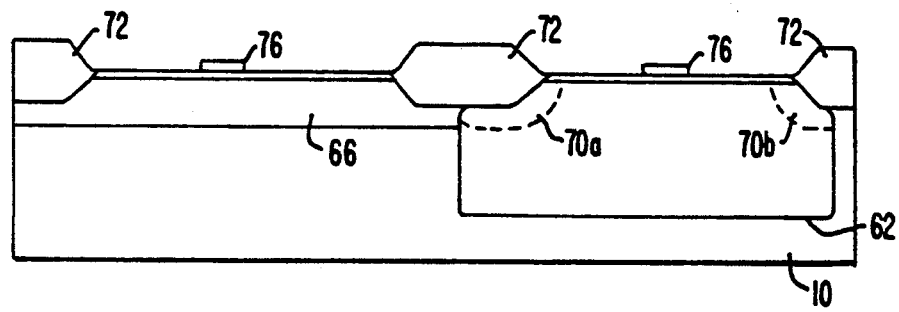
Figure 3G:
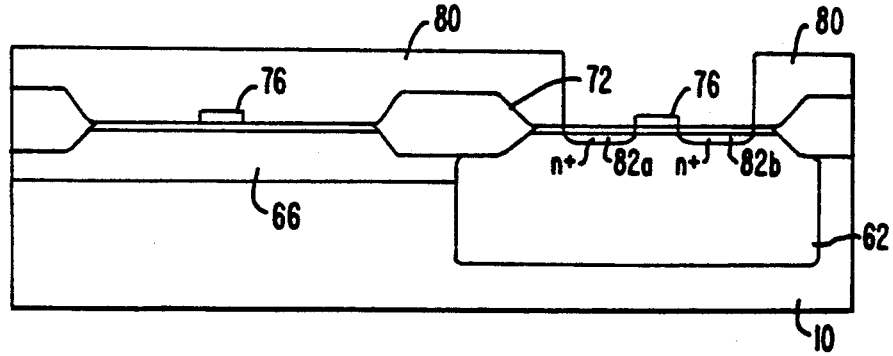
Figure 3H:
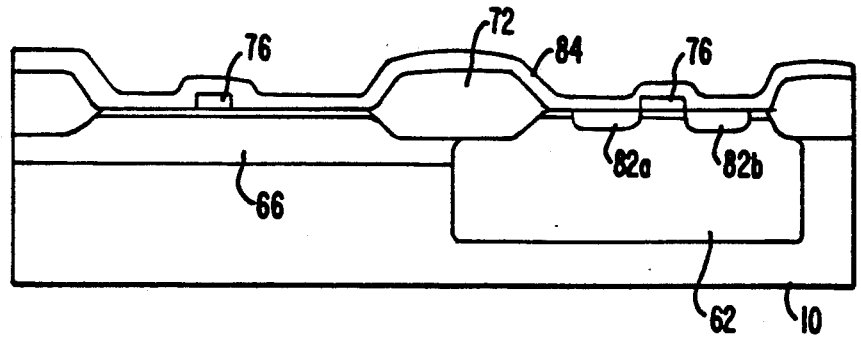
Figure 3I:
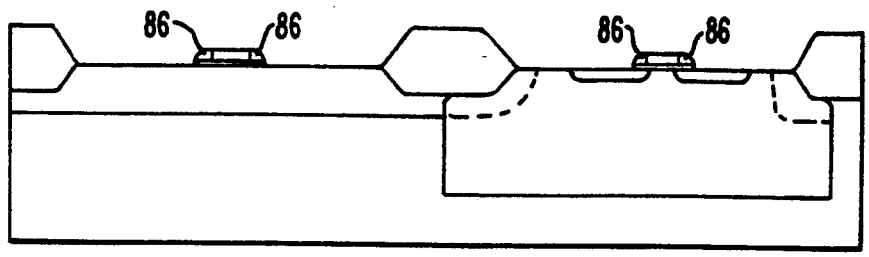
Figure 3J:
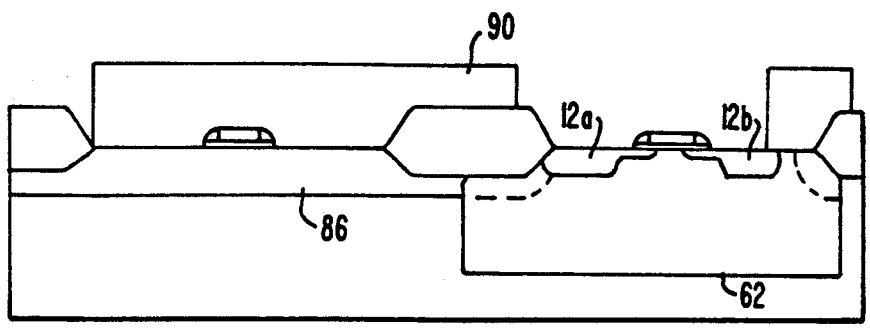
Figure 3K:
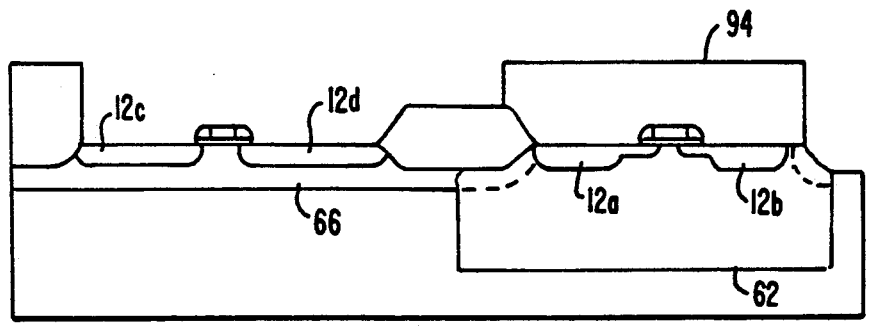
Figure 3L:
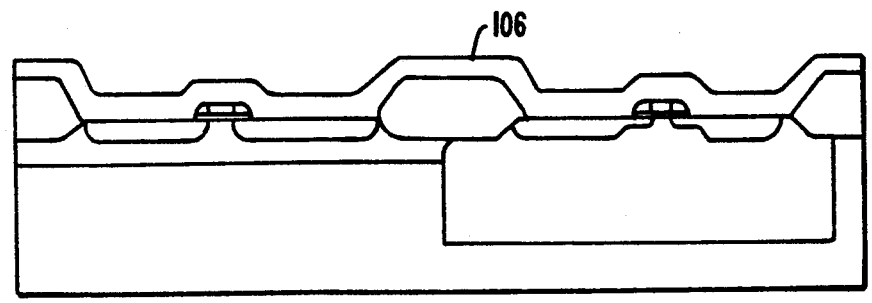
Figure 3M:
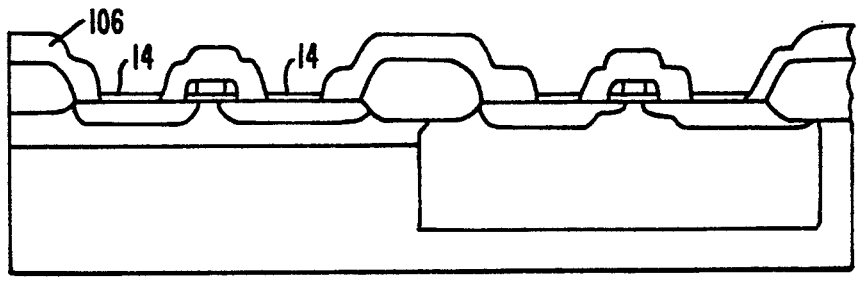
Figure 3N:
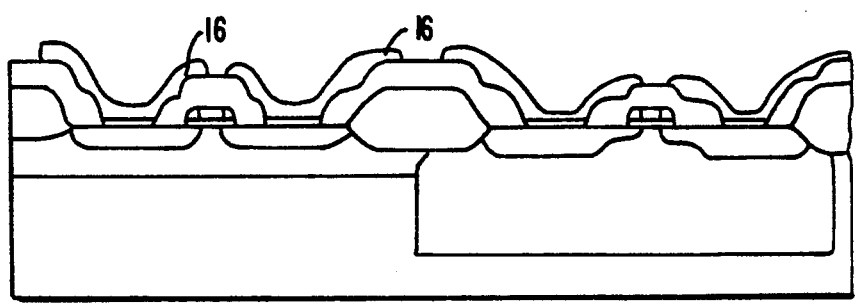
Figure 3O:
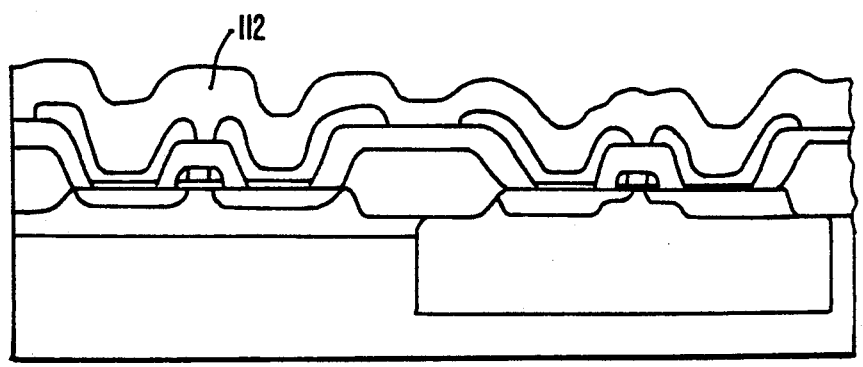
Figure 3P:
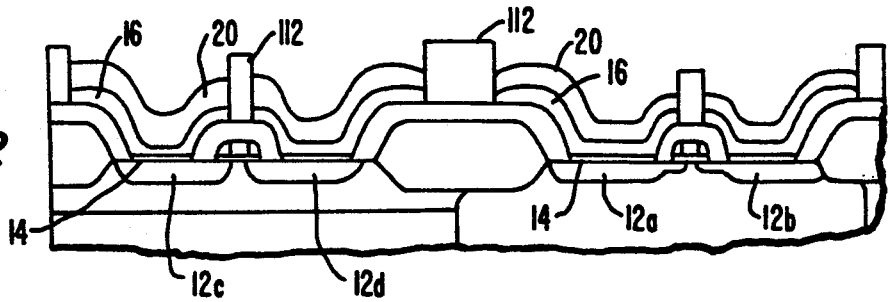

FIGS. 3A–3P depict the standard processing steps for forming CMOS transistors and illustrate the ease with which the fabrication of the PID structure of the present invention can be integrated within those standard steps. The formation of twin wells and active regions is depicted in FIGS. 3A–3C.

FIG. 3A is a cross-sectional view of a semiconductor structure which may be fabricated using well known process technology. The structure depicted in FIG. 3A serves as a starting point for a description of the process of the present invention. The structure includes a semiconductor substrate 50, such as a lightly doped n-type silicon substrate or an n-type silicon substrate with a lightly doped n-type epitaxial silicon layer formed thereon by conventional chemical vapor deposition techniques. On semiconductor substrate 50, a thin layer of silicon dioxide 54 is thermally grown. On the upper surface of silicon dioxide layer 54, a layer of photoresist 56 is formed. Photoresist 56 is well known photoresist conventionally available from many suppliers. Using well known masking techniques, photoresist 56 is exposed and developed so that a portion of photoresist 56 is removed from the region where a p-well is desired. Then the exposed portion of silicon dioxide 54 is etched using well known process techniques such as a wet chemical bath of buffered hydrofluoric (HF) acid or a dry etch process based on a gaseous plasma. By a conventional predeposition process, a high-energy, large-dose p-type dopant, such as boron, is introduced into semiconductor substrate 50 to form p-type region 58.

Next, a protective layer of silicon dioxide 60 is grown over p-type region 58. Then, the p-type dopant is driven in an oxidizing atmosphere to form p-well 62. Photoresist 56 is removed. The structure at this stage is shown in FIG. 3B. After the p-well diffusion, silicon dioxide 60 is stripped off.

In FIG. 3C, a layer of photoresist 64 is formed over the entire structure. Using well known masking techniques, photoresist 64 is exposed and developed so that a portion of photoresist 64 is removed from the region where an n-well is desired. Then, an ion implantation is performed to introduce n-type impurities into semiconductor substrate 50 to form n-well 66.

As shown in FIG. 3D, a layer of stress-relief oxide 67 and a layer of silicon nitride 68 are formed on the upper surface of the entire structure and are patterned using the well known techniques to define the desired active regions. Then, a boron implantation is performed to create channel-stop regions 40a and 40b. The channel-stop implant p+ prevents a channel from forming outside the active region. Silicon nitride 68 acts as a mask for the boron ions.

An oxidation step is then performed to thermally grow a layer of thick field oxide 72, as shown in FIG. 3E. During this operation, oxygen penetrates beneath the edges of silicon nitride 68, forming the characteristic bird beak shape of field oxide 72 near the active region edge. At the same time, both n-well 66 and p-well 62 are rediffused deeper into semiconductor substrate 50. After forming field oxide 72, silicon nitride 68 mask is removed and stress-relief oxide 67 is etched. Then, a layer of gate oxide 76 is formed by heating semiconductor substrate 50 in an atmosphere comprising oxygen and steam.

As shown in FIG. 3F, gate electrodes 76 are formed over n-well 66 and p-well 62. Gate electrodes 76 are typically formed by depositing a layer of n-type polycrystalline silicon over the structure illustrated in FIG. 3E. Then, conventional photolithographic and etching techniques are used to pattern the poly and define the gates.

As shown in FIG. 3G, a layer of photoresist 80 is then deposited over the entire structure and patterned to form openings to expose p-well 62. Then, phosphorus is ion implanted into p-well 62 to form shallow n+ regions 82a and 82b used to reduce the short channel effect.

In FIG. 3H, a layer of silicon dioxide 84 is deposited over the entire structure using conventional chemical vapor deposition techniques.

The structure is then etched using a conventional anisotropic plasma etchant, such as chlorine, so that oxide spacers 86 remain on the vertical sidewalls of gate electrodes 76, as shown in FIG. 3I.

FIGS. 3J and 3K depict the conventional LDD (lightly doped drain) formation steps. In FIG. 3J, the entire structure is covered with a layer of photoresist 90 which is then patterned to expose p-well 62. Next, source and drain regions 12a and 12b are formed in p-well 62 by implanting arsenic dopant. Then, photoresist 90 is removed using a conventional solvent.

In FIG. 3K, another layer of photoresist 98 is applied over the entire structure and is patterned so that n-well 66 is left exposed. Then, a boron dopant (or boron difluoride) is implanted. This implantation step forms source and drain regions 12c and 12d in n-well 66. Photoresist 98 is then removed.

Both implantation steps are followed by thermal annealing during which both phosphorus and boron diffuse, thus shifting the lateral edges of the drains and sources. Due to the larger diffusivity of boron, the edges of source and drain regions 12c and 12d in n-well 66 are moving faster than the edges of the source and drain in p-well 62. Consequently, the overlap of the gate with the heavily doped portions of source and drain is much smaller in p-well 62 than in n-well 66.

As shown in FIG. 3L, the entire structure is covered with a first insulating layer of low-temperature oxide (LTO) 106. Alternatively, phosphorus-doped $SiO_2$ phosphosilicate glass (PSG) or boron-phosphorus-doped $SiO_2$ phosphosilicate glass (BPSG) can be deposited over the entire structure. A thermal treatment that causes PSG to flow may be used to smooth the surface of the structure.

As shown in FIG. 3M, the first insulating layer 106 is etched to open contacts. Then, by a thermal oxidation a thin layer of silicon dioxide 14 is grown on the exposed regions. Silicon dioxide 14 has a thickness in the range of 50 to 120 Angstroms.

Immediately following the thermal oxidation step, a layer of intrinsic polycrystalline silicon 16 is deposited to a thickness in the range of 100 to 3000 Angstroms over the entire structure. Intrinsic poly 16 is then etched to form the antifuse dielectric layer and to isolate the programmable interconnect device structures 10 from each other. The structure at this stage is shown in FIG. 3N. Thus, the formation of the PID structure requires only a single extra mask to pattern the intrinsic poly second layer 16. The remaining processing steps are standard.

In FIG. 3O, a second insulating layer of silicon dioxide 112 is grown over the entire structure.

As shown in FIG. 3P, the second insulating layer 112 is etched to open contacts. Referring back to FIG. 1B, note that the upper surface of antifuse layer and the surface of the substrate are contacted by the aluminum metal layer at the bit and ground diffusions. After the contact holes are opened the device is dipped into an HF solution to clean the exposed surface of the substrate prior to depositing the metal.

If aluminum oxide or silicon oxide were used as the antifuse dielectric layer 21 then this standard CMOS cleaning step would etch away part of the antifuse layer and create defects in the layer. During the step of depositing the antifuse layer the thickness would need to be increased to compensate for this etching and assure sufficient thickness insulate the upper and lower conductive layers before programming. The thickness of the final layer is unpredictable and therefore the electrical characteristics of the layer will vary. Thus yield and performance is degraded.

Because intrinsic poly is not etched by an HF solution, the intrinsic poly antifuse layer 21 utilized in the PID 10 of the present invention is not etched during the HF pre-metallization cleaning step. Accordingly, the thickness of the layer can be precisely controlled during the deposition step and no defects are introduced into the layer during the cleaning step.

Next, a layer of aluminum 20 is deposited over the entire structure and is patterned to form basic connections in the circuit. Alloys of aluminum, molybdenum, and tungsten may also be used for this purpose.

The surface of the IC fabricated with this process may be very rough. Therefore, the surface of the IC will be planarized to complete the device using a well-known technique (not shown).

The programmable interconnect device fabricated by the use of the standard CMOS has been described. However, the present invention can be easily adapted to fit into other process technologies, such as BiCMOS, NMOS and bipolar, by those skilled in semiconductor processing.

While the above is a complete description of the preferred embodiments of the invention, various alternatives, modifications and equivalents may be used. For example, the antifuse layer can be formed by a single layer of intrinsic poly instead of the two-layer oxide/poly structure depicted in FIG. 1A. Therefore, the above description should not be taken as limiting the scope of the invention which is defined by the appended claims.

What is claimed is:

1. In a method of manufacturing a standard complementary metal oxide semiconductor (CMOS) device on a semiconductor substrate, said method including the steps of forming wells in said substrate, defining active regions in said wells, forming gate regions over said wells, forming drain and source regions in said well, and depositing a first insulating layer over said substrate, an improved method of manufacturing a plurality of programmable interconnect devices (PIDs) comprising the steps of:

forming a plurality of PID contact openings through said first insulating layer over said active regions to expose a plurality of portions of said active regions at a plurality of predetermined locations;

forming a lower antifuse layer of silicon dioxide on each of the exposed portions of said active regions;

forming a plurality of islands of intrinsic undoped polycrystalline silicon in said PID contact openings, each overlying a corresponding one of said lower antifuse layers; and forming a plurality of conductive contacts, with each conductive contact in a first plurality overlying one of said islands of intrinsic undoped polycrystalline silicon and with the conductive contacts electrically isolated from each other, whereby, said programmable interconnect devices are manufactured at said predetermined locations after the remaining steps of said method of manufacturing a standard CMOS device are completed.

2. The method of claim 1 wherein said step of forming said lower antifuse layer includes the step of growing a silicon dioxide layer having a thickness of from about 50 to about 120 Angstroms on the surface of each exposed portion.

3. The method of claim 2 wherein said step of forming said islands includes the step of depositing an undoped polycrystalline silicon layer having a thickness equal to a desired final thickness in the range of from about 100 to about 3,000 Angstroms.

4. The method of claim 3 wherein said step of forming said plurality of conductive contacts includes the steps of:

depositing a second insulating layer overlying said islands and said substrate;

forming a first plurality second contact openings in said second insulating layer to expose said islands and a second plurality of second contact openings to expose selected regions of said active regions;

cleaning said exposed selected regions and islands with HF; and forming said conductive contacts over said exposed and cleaned selected contacts and islands.

5. In a method of manufacturing a standard complementary metal oxide semiconductor (CMOS) device on a semiconductor substrate, said method including the steps of forming wells in said substrate, defining active regions in said wells, forming gate regions over said wells, forming drain and source regions in said well, and depositing a first insulating layer over said substrate, an improved method of manufacturing a programmable interconnect device (PID) comprising the steps of:

forming a PID contact opening through said first insulating layer over an active region to expose a portion of said active region at a predetermined location;

forming a lower antifuse layer of silicon dioxide on the exposed portion of said active region;

forming an island of intrinsic undoped polycrstalline silicon in said PID contact opening overlying a said lower antifuse layer; and forming a conductive contact overlying said island of intrinsic undoped polycrystalline silicon, whereby, said programmable interconnect devices are manufactured at said predetermined locations after the remaining steps of said method of manufacturing a standard CMOS device are completed.

6. The method of claim 5 wherein said step of forming said lower antifuse layer includes the step of growing a silicon dioxide layer having a thickness in the range of from about 50 to about 120 Angstroms.

7. The method of claim 6 wherein said step of forming an island includes the step of depositing an undoped polycrystalline silicon layer having a desired final thickness in the range of from about 100 to about 3,000 Angstroms.

8. The method of claim 7 wherein further comprising the steps of:

depositing a second insulating layer overlying said island and said substrate;

forming a first contact opening in said second insulating layer to expose said island and a second contact opening to expose a selected region of an active region;

cleaning said exposed selected region and island with HF; and forming said conductive contacts over said exposed and cleaned selected region and island.

9. In a method of manufacturing a standard complementary metal oxide semiconductor (CMOS) device on a semiconductor substrate, said method including the steps of forming wells in said substrate, defining active regions in said wells, forming gate regions over said wells, forming drain and source regions in said wells, and depositing a first insulating layer over said substrate, an improved method of manufacturing a programmable interconnect device (PIDs) comprising the steps of:

forming a PID contact opening through said first insulating layer over an active region to expose a portion of said active region at a predetermined location;

forming an island of intrinsic undoped polycrystalline silicon in said PID contact opening overlying the exposed portion of said active region; and forming a conductive contact overlying said island of intrinsic undoped polycrystalline silicon;

whereby said programmable interconnect device is manufactured at said predetermined location after the remaining steps of said method of manufacturing a standard CMOS device are completed.

10. The method of claim 9 wherein said step of forming said island includes the step of depositing a polycrystalline silicon layer having a desired final thickness in the range of from about 100 to about 3,000 Angstroms.

11. The method of claim 10 wherein further comprising the steps of:

depositing a second insulating layer overlying said island and said substrate;

forming a first contact opening in said second insulating layer to expose said island and a second contact opening to expose a selected region of an active region;

cleaning said exposed selected region and island with HF; and forming said conductive contacts over said exposed and cleaned selected region and island.

* * * * *